United States Patent [19]

Meurer et al.

[11] 3,742,362

[45] June 26, 1973

[54] SIGNAL-SEEKING COMMUNICATIONS RECEIVER WITH BIDIRECTIONAL FREQUENCY SWEEP CAPABILITY

[75] Inventors: Heinz Hubert Meurer; Willy Kanow, both of Berlin, Germany

[73] Assignee: Loewe-Opta GmbH, Berlin, Germany

[22] Filed: July 27, 1971

[21] Appl. No.: 166,432

[30] Foreign Application Priority Data

July 30, 1970 Germany .................. P 20 38 694.1

[52] U.S. Cl. .............. 325/470, 179/15 BT, 325/422, 325/423, 325/468

[51] Int. Cl. .............................................. H04b 1/34

[58] Field of Search ............................ 325/468–470, 417–423, 453–454, 457–459; 334/11, 14–16; 179/15 BT

[56] References Cited

UNITED STATES PATENTS 3,631,349 12/1971 Rhee .................................. 325/470

3,293,572 12/1966 Smith .................................. 325/469

*Primary Examiner*—Albert J. Mayer

*Attorney*—Burton I. Levine and Arthur O. Klein

[57] ABSTRACT

A voltage-tuned, mono-stereo, signal-seeking receiver automatically sweeps any desired portion of the received band in either direction. During forward sweeps, a capacitor whose voltage controls the tuning stage charges through an operational amplifier which biases a transistor in a discharge path into a disabled state. Upon the occurrence of a signal whose detected amplitude is above a threshold corresponding to the transistor bias, the discharge path is activated to stop the forward sweep. During each reverse sweep, the discharge of the capacitor yields an oppositely poled bias voltage which locks the transistor in its conductive state. The reverse sweep continues until another signal exceeding the threshold in the opposite direction is detected to disable the transistor. Facilities are provided to lock out mono stations during each sweep, as well as to provide auxiliary pre-select tuning and AFC capabilities.

15 Claims, 5 Drawing Figures

INVENTORS:
HEINZ HUBERT MEURER
WILLY KANOW
BY:
Arthur O. Klein
ATTORNEY

INVENTORS
HEINZ HUBERT MEURER
WILLY KANOW
BY: Arthur O. Klein
ATTORNEY

*INVENTORS:*
HEINZ HUBERT MEURER
WILLY KANOW

*BY:* Arthur O. Klein
*ATTORNEY*

SIGNAL-SEEKING COMMUNICATIONS RECEIVER WITH BIDIRECTIONAL FREQUENCY SWEEP CAPABILITY

BACKGROUND OF THE INVENTION

Signal-seeking communications receivers, particularly certain types of mono-stereo radio sets, are available with employ voltage-dependent capacitances in the RF tuning stages. These devices can seek out and lock on strong signals in the received band by employing sawtooth or similar voltages developed across a capacitor to sweep the frequency of the receiver.

If the amplitude detected at the output of the demodulator stage during such sweep exceeds a predetermined threshold, the sweep terminates at the corresponding frequency. The upward sweep can be started again from the frequency position of such locked-in signal until the next signal that exceeds the threshold is detected.

A disadvantage of this arrangement is that, in general, such signal-seeking capability is restricted to upward frequency sweeps only. When a particular sweep reaches the highest frequency in the band, fly-back occurs and the sweep starts upward again from the lowest frequency. Therefore, if the set has locked on a particular frequency and it is desired to search for a strong station slightly below the frequency of the locked-in station, it is necessary for the receiver to first sweep upward to the highest frequency, fly back to the lowest frequency and then sweep upward from there to the desired frequency.

SUMMARY OF THE INVENTION

This disadvantage is overcome in the signal-seeking, voltage-tuned communication receiver of the present invention, in which the frequency band may be swept in either of two opposite directions from any given starting point in the band, and in which a signal having an amplitude above the threshold may be detected during a sweep in either direction.

Illustratively, the capacitor controlling the tuning stage is provided with a changing path including one input and an output of an operational amplifier, and with a separate discharge path including the collector-emitter path of a transistor. The emitter of the transistor is coupled to the output of the operational amplifier, and the base of the transistor is coupled to the output of the demodulator, which output typically exhibits positive and negative peaks for each detected signal component.

The charging mode is initiated manually by a reversing switch which momentarily interconnects the emitter and base of the transistor; this inhibits conduction of the transistor and therefore activation of the discharge path. As the capacitor charges to effect a forward sweep in the absence of a strong signal, a corresponding voltage developed at the output of the operational amplifier places a reverse bias on the emitter, thereby locking the transistor in the non-conductive state.

When a signal having a high enough peak amplitude to overcome the reverse bias is applied to the base of the transistor, the later conducts to activate the discharge path and stop the sweep.

Conversely, when a reverse sweep is desired, the reversing switch is momentarily operated to interconnect the base and collector of the transistor to cause the latter to conduct and thereby initiate discharge of the capacitor through the now-enabled discharge path. Since the capacitor is connected to the operational amplifier, the reverse current now flowing through the capacitor causes a voltage opposite from that present during charge to be present at the input (and thereby the output) of the operational amplifier. Therefore, a forward bias is applied to the emitter of the transistor, and this action locks the transistor in its conductive state. The reverse sweep is maintained until the first occurrence of a signal component whose peak amplitude (of opposite polarity to that applied during the forward sweep) exceeds the forward bias. The transistor then ceases to conduct to disable the discharge path and stop the reverse sweep.

Preferably, each of the charging and discharge paths has a constant-current semi-conductive element with two externally accessible terminals such as a field effect transistor with its gate electrode tied to its drain electrode (such element being hereafter referred to for convenience as a "field-effect diode"), so that the capacitor voltage changes (and thereby the respective frequency sweeps) are linear.

The apparatus may include a voltage divider whose input terminals are disposed in the charging path and whose output terminals are disposed in the discharge path, whereby the emitter bias voltage for the transistor is supplied by the voltage divider output. If the receiver ordinarily accepts both mono and stereo frequencies in the received band, such voltage divider arrangement permits an improved technique for selectively locking out the mono frequencies during a sweep. In particular, by raising the output-input voltage ratio of the voltage divider (as by a second switch connected across the voltage divider output) the emitter bias voltage during the sweep can be initially raised so high as to prevent any incoming signal from being captured during a sweep. Then, by using the pilot signal conventionally accompanying a stereo frequency to selectively lower the output-input ratio (as by controlling a suitable field-effect transistor also shunting the voltage divider output) the emitter bias can be lowered again when a stereo signal is present, thereby permitting detection of stereo frequencies only.

If desired, the apparatus may be also provided with facilities to operate in an auxiliary pre-select tuning mode whereby the voltage tuning stage of the receiver may be decoupled from the capacitor and instead may be made responsive to the output of a potentiometer whose tap is fixed at a particular voltage corresponding to a fixed frequency in the band. Alternatively, the potentiometer may be adjusted manually. Normally, such pre-select operation is instrumented by powering the potentiometer from a separate voltage source. However, an AFC capability may be added to this mode by employing the output of the capacitor to excite the potentiometer.

BRIEF DESCRIPTION OF THE DRAWING

The invention and its advantages are discussed more fully in the following detailed description taken in conjunction with the appended drawings, in which.

DETAILED DESCRIPTION

Figure 1:
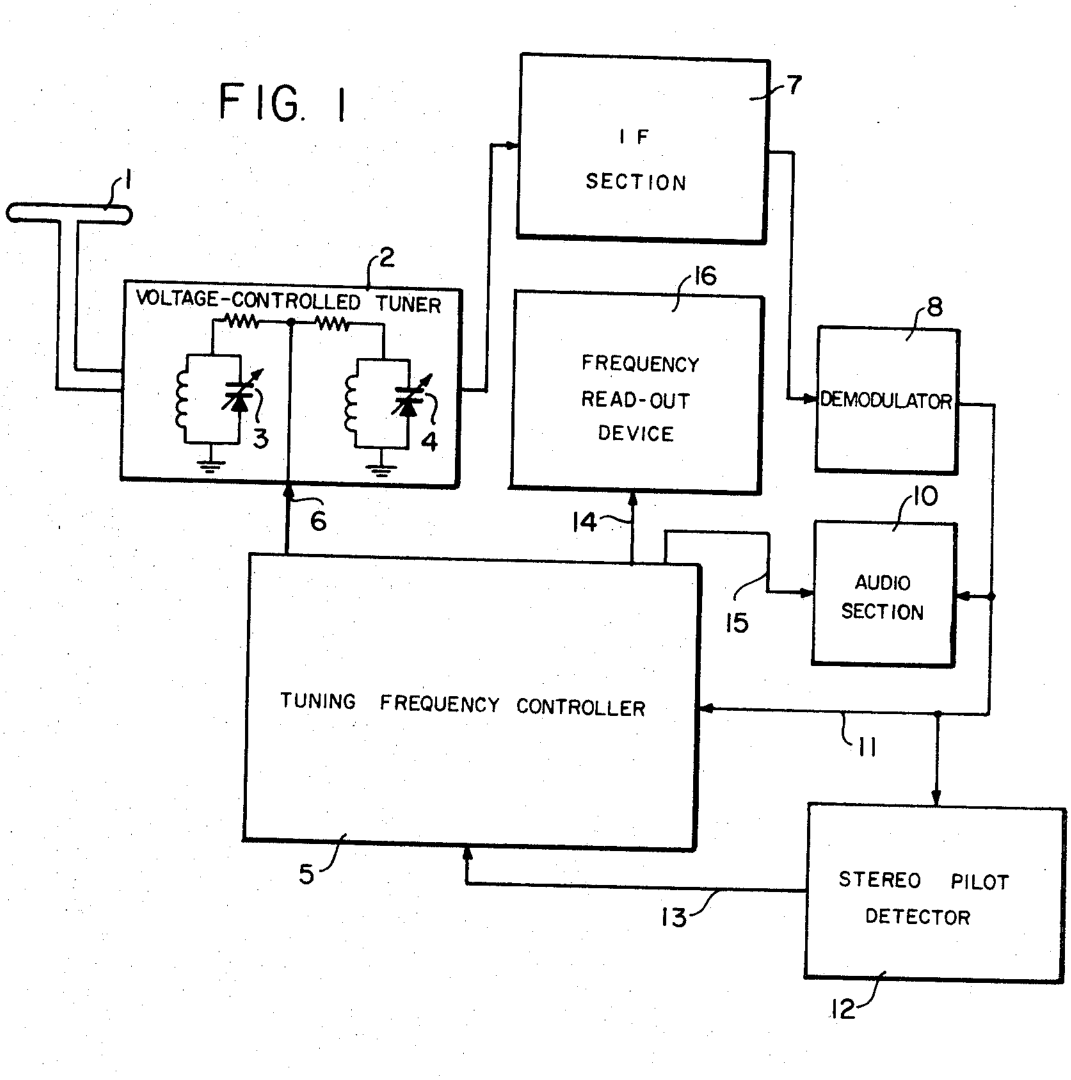
FIG. 1 is a block diagram of a voltage-tuned signal-seeking receiver for accepting both mono and stereo frequencies.

Referring now to the drawing, FIG. 1 depicts a communication receiver having facilities for receiving both mono and stereo frequencies via a conventional RF antenna 1. (For reasons indicated below, incoming stereo frequencies are generally accompanied by suitable pilot signals for identification purposes.)

The output of the antenna 1 is coupled to a voltage controlled tuning stage 2 which, as is shown schematically, employs capacitive diodes 3 and 4 whose capacitance increases with increase of voltage applied thereto. Such tuning control voltage is supplied by a tuning frequency controller 5 via a line 6.

Figure 2:
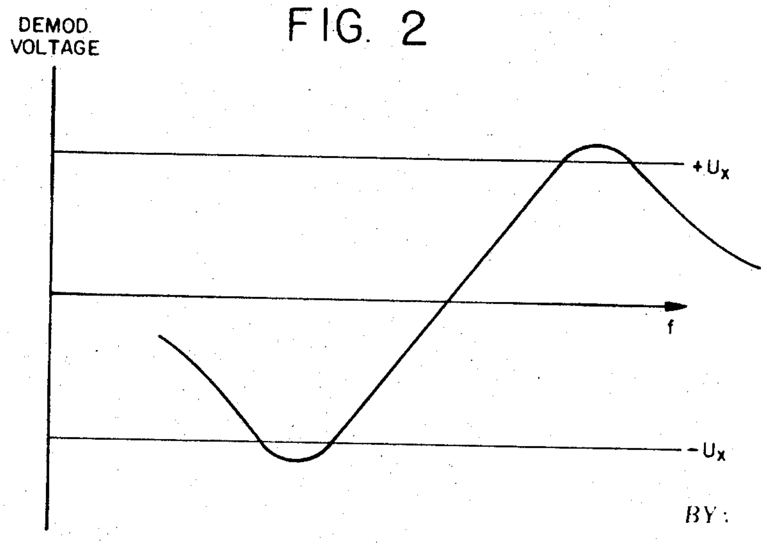
FIG. 2 is a curve showing a typical demodulator output for a signal component with the broadcast spectrum received by the receiver of FIG. 1.

The output of the tuner 2, which may incorporate suitable frequency converter circuitry as required, is coupled through an IF Section 7 to a demodulator 8. A typical signal in the output of the demodulator (which may be a conventional FM discriminator) is shown in curve 9 of FIG. 2. Such signal has both relatively positive and relatively negative peaks. (The positive and negative voltages UX indicated in FIG. 2 should be ignored for being.) time being).

The output of the demodulator 8 (FIG. 1) is coupled to an audio section 10 of the receiver in a conventional manner, and is also fed back via a line 11 to the frequency controller 5.

In general, the controller 5 is operative in two basic modes hereafter designated "search mode" and "preselect mode". In the search mode, which is essentially a closed loop operation, the tuning voltage output on line 6 is a sweep signal which varies the tuned frequency of the state 2 until an appropriate one of the peaks of the demodulated signal received by the receiver exceeds a predetermined threshold voltage. When this occurs, the sweep of the voltage on line 6 terminates and the voltage value last reached is held constant on the line 6. The receiver thereby remains tuned at the corresponding frequency.

In the pre-select mode, the voltage output on line 6 is adjusted to a desired value (usually by push buttons or knobs, not shown in FIG. 1) and the tuner stage 2 remains tuned to the corresponding frequency. While the pre-select mode is basically an open loop operation, AFC capabilities may be superimposed thereon if desired.

The output of the demodulator 8 is also coupled to a conventional stereo pilot detector 12 which responds to the pilot signal portion of each demodulated stereo frequency component to generate an output voltage on a line 13. Such voltage is coupled to the controller 5 to selectively prevent the receiver from locking on a mono frequency during the frequency sweeps in the search mode.

Controller 5 is provided with two auxiliary outputs on lines 14 and 15. The line 14 is coupled to a conventional read-out device 16, which monitors the instantaneous frequency of the tuning stage 2.

The output on line 15 serves as a "silent signal" command for the audio section 10 to inhibit annoying noises from emanating from the receiver during the frequency sweeps in the search mode.

When conventional signal-seeking radios constructed in accordance with FIG. 1 operate in the search mode, the frequency sweep is unidirectional, generally in an upward direction.

Figure 3:
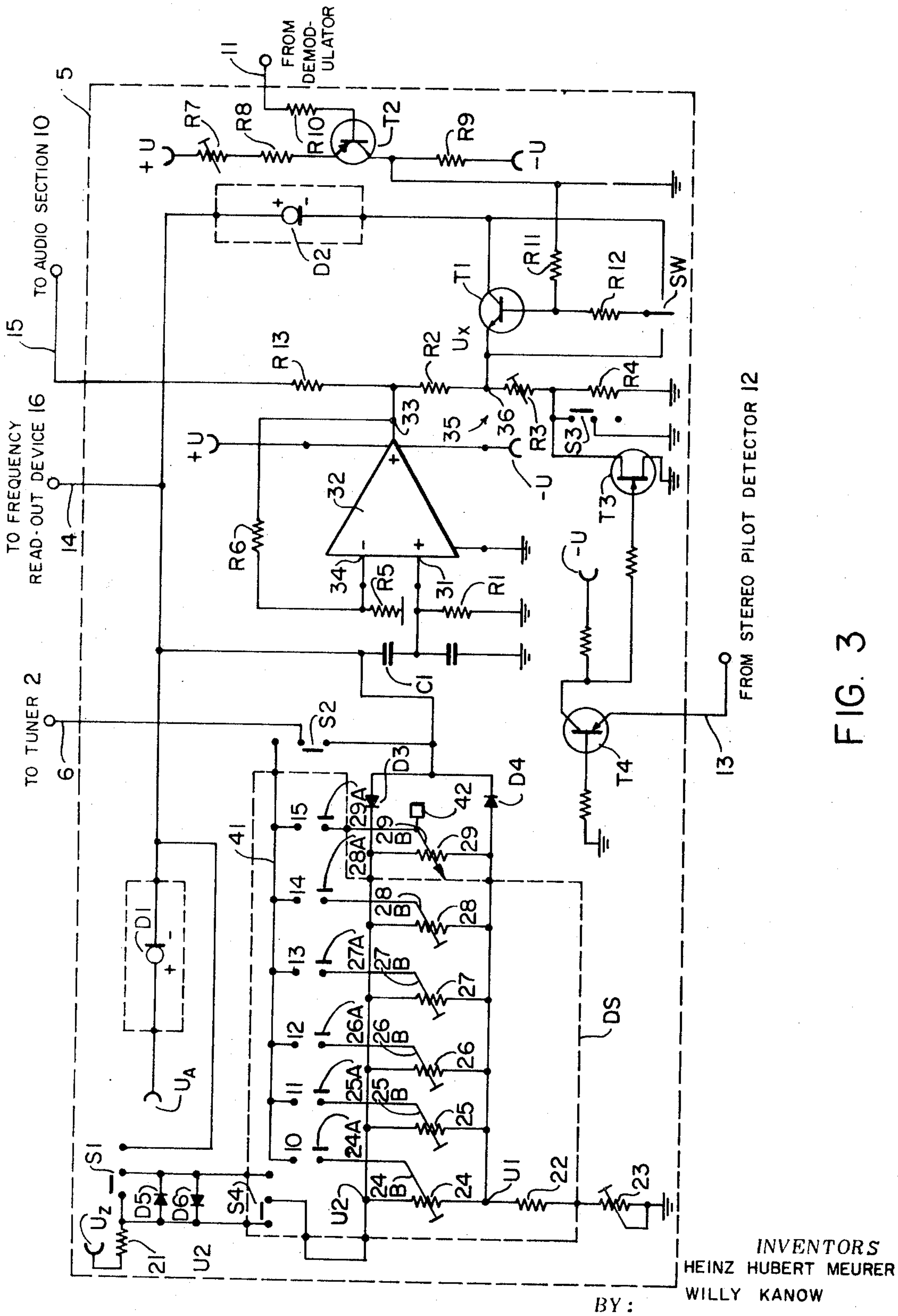
FIG. 3 is a schematic diagram of a first form of tuning frequency controller constructed in accordance with the invention for use in the receiver of FIG. 1.

In accordance with the invention, the improved frequency controller shown in FIG. 3 provides bidirectional frequency sweep capability whereby the received band (both mono and stereo or stereo only) may be swept in either of two opposite directions from any given starting point in the band thereby permitting detection of a signal having an amplitude above a preset threshold during a sweep in either direction.

The controller is provided with double-throw switches S1, S2, S3 and S4 which may be set to establish a desired receiver operating mode as in TABLE I below:

TABLE I

| Mode | Switch Settings S1 | S2 | S3 | S4 |
|---|---|---|---|---|
| A) Search (mono and stereo) | Left | Down | Up | Left |
| B) Search (stereo only) | Left | Down | Down | Left |
| C) Preselect (w/o AFC) | Right | Up | | Left |
| D) Preselect (w/AFC) | Right | Up | | Right |

Initially, it will be assumed that the controller 5 is operating in Search mode "A"; the switch positions for this mode are those illustrated in FIG. 3.

In the search mode, the tuner control line 6, as well as the line 14 to the frequency readout device 16, are connected directly to a capacitor C1.

Hence, whenever the capacitor C1 changes as described below, the resultant increase of voltage on line 10 sweeps the frequency of the tuner 2 upwards; and whenever the capacitor discharges, the resultant decrease of voltage on the capacitor sweeps the frequency of the tuner 2 downwards.

In order to assure a linear frequency sweep, the capacitor C1 may be charged from a constant-current source established by a field effect diode D1 biased by a source of positive voltage VA. As is well known, such a diode exhibits constant current characteristics over a range of voltages which may be appropriately chosen in this case to encompass the range of voltages handled by the capacitor C1. Such range of voltage may illustratively be set between the values U1 and U2, which are respectively established by clamping circuits including diodes D3 and D4. The upper limit U2 for example, is the potential at the cathode of the diode D3 and constitutes the voltage at one output tap of the voltage divider consisting of resistors 21 and 22, potentiometer 23, and parallel-connected potentiometers 24–29. Such voltage divider is excited by a voltage Uz. The lower limit U1 is the voltage at the anode of diode D4 and constitutes the potential at a second tap of such voltage divider.

The charging path for the capacitor C1 from the constant-current diode D1 includes (a) one input 31 of an operational amplifier 32; (b) the amplifier output 33; and (c) the input terminals of a voltage divider 35 including resistors R2, R3, and R4. (In the search mode, the switch S3 shorts the resistor R4 as shown).

The output of the operational amplifier 32 is also fed back through resistor R6 to a complementary input 34 thereof.

The constant current established through the capacitor C1 during charge yields a proportional voltage across resistor R1 at the input 31 of the operational amplifier, which results in a voltage UY at the amplifier output. This latter voltage constitutes the exciting voltage for the voltage divider 35. Under these circumstances, a tap 36 of the voltage divider between resistors R2 and R3 exhibits a potential Ux which as indicated below, establishes a positive threshold voltage for the controller 5.

Such threshold can be raised or lowered by changing the output-input voltage ratio of the voltage divider; e.g., by adjusting the resistance of R3.

The voltage VY is also coupled to the audio section 10 of the receiver via a resistor R13 and the line 15 to serve as a "silent tuning" command during the frequency sweep.

The capacitor C1 is further provided with a discharge path including (a) a second constant-current diode D2; (b) the collector-emitter path of an NPN transistor T1; and (c) the output terminals of the voltage divider 35, with the tap 36 of the voltage divider connected to the emitter of the transistor T1.

The resulting discharge path will be opened whenever the transistor T1 is made conductive, and the resulting discharge of the capacitor C1 will be at a linear rate because of the constant-current operation of the diode D2. (The total current through the capacitor D2 will be in general twice that through the charging diode D1, since during discharge the diode D2 will handle the sum of the current through diode D1 and the capacitor discharge current.)

The output voltage of the demodulator 8 incident on the controller 5 is coupled, through resistors R10 and R11 and the base-collector path of a normally conductive PNP transistor T2, to the base of the transistor T1. The transistor T1 will thus be made conductive whenever the signal applied to the base of transistor T1 exceeds the threshold Ux in the positive direction.

A rocker switch SW is coupled to the base of the transistor T1 through a resistor R12 for momentarily connecting such base to either the collector or the emitter of the transistor T1.

In the following illustrative operation of the receiver in the search mode with the apparatus as so far described, it will be assumed that (a) the receiver has just been turned on; (b) the voltage on the capacitor C1 is at its lowest value U1 corresponding to the lowest frequency in the band to be swept; and (c) the receiver is first to be swept upward in frequency to capture a first strong signal in the band, and following such capture, the receiver is to be swept downward in frequency to capture a second strong signal.

To initiate the upward sweep, the rocker switch SW is momentarily rotated clockwise as viewed in FIG. 3 to effectively short the base-emitter path and insure non-conduction of the transistor T1 notwithstanding the presence of any slightly positive voltage at the collector of transistor T2. The discharge path for the capacitor is thus disabled, and the capacitor C1 charges via the constant current diode D1, the operational amplifier 32 and the voltage divider 35; and the receiver frequency tracks accordingly. The positive threshold voltage Ux immediately developed across the output of the voltage divider 35 reverse-biases the emitter of the transistor T1 to lock such transistor in its non-conductive state, so that the rocker switch SW may be released. The capacitor C1 continues to charge until the occurrence of a signal component at the output of the demodulator, whose negative peak (FIG. 2), referred to the base of the transistor T1 (FIG. 1) after being altered in amplitude and shifted 180° in phase by the transistor T2, exceeds the threshold voltage Ux. At this point, the transistor T1 conducts to enable the discharge path, thereby terminating the charge of the capacitor and stopping the upward frequency sweep at the frequency (hereinafter frequency "S") corresponding to the strong signal component just described.

The termination of the capacitor charging operation stops the flow of current through resistor R1, so that the voltage VY (and the emitter voltage of the transistor T1) drops to zero. The inhibiting "silent tuning" signal is thereby removed from the audio stage 10. The receiver frequency will remain locked at frequency "S". Assuming the tuning characteristic of the demodulator 8 has a negative slope through zero at the locked in frequency "S", any tendency of the tuning stage 2 to drift upward upward in frequency will cause the demodulator output to become more negative and such output (referred again to the base of the transistor T1 after having been rotated 180° in phase) will again cause the transistor T1 to conduct and thereby enable the discharge path for the capacitor C1. The resulting discharge of the capacitor lowers the tuning voltage to bring the demodulator output back toward zero in the positive direction and disables the transistor T1, so that the tuning stage again comes to rest at frequency "A". Similar compensation will occur when the receiver tends to drift downward in frequency. Since the emitter voltage on the transistor T1 during such regulation remains essentially at zero, the presence or absence of the few tenths of a volt necessary on the base of transistor T1 to establish the appropriate state thereof during such regulation may be obtained, e.g., by appropriately setting the resistor R7 in the emitter circuit of the transistor T2.

In order to initiate the downward frequency sweep from a starting point at frequency "S", the rocker switch SW is momentarily rotated counterclockwise to interconnect the base and collector of the transistor T1. This will put both the collector and base at a positive potential (derived from the collector of the transistor T2) with respect to the emitter of the transistor T1, which rests at zero as explained above. Hence, the transistor T1 assumes its conductive state, and the capacitor voltage begins to linearly decrease from the value corresponding to frequency "S".

The linear discharge of the capacitor C1, which preferably occurs at a rate equal to its rate of charge, results in a voltage across R1 which is opposite in phase with respect to the voltage developed thereacross during charge. This voltage, applied to the input 31 of the operational amplifier 31, immediately yields at the tap 36 of the voltage divider 35, a voltage Ux which forward-biases the emitter of the transistor T1 to lock such transistor in its conductive state. Therefore, the rocker switch SW can now be released. The capacitor C1 continues to discharge, and the receiver frequency continues to be swept downward, until the occurrence at the output of the demodulator of a signal component whose positive peak (referred to the base of the transistor T1 after being altered in amplitude and rotated 180° in phase by the transistor T2) is sufficient in amplitude to overcome the forward bias voltage −Ux on the emitter of transistor T1, and thereby disable the transistor T1. The discharge of the capacitor C1 is accordingly terminated at the frequency (frequency "T") corresponding to such strong signal, and the receiver is thereafter locked onto such frequency until the next frequency sweep, up or down, is initiated in the manner described above.

If it is desired to lock out all mono signals during such sweep, and thereby operate the receiver in the "stereo-only" search mode "B", the switch S3 is initially moved into its lower position as viewed in FIG. 3, thereby removing the short circuit across R4 and significantly increasing the output-input voltage ratio of the voltage divider 35. During each frequency sweep, therefore, the threshold voltage UX may be fixed at a value higher than the peak of any demodulated signal component intercepted during the sweep. In order to be able to capture the stereo components during such sweep, the voltage coupled to the controller 5 from the stereo pilot detector 12 in response to each occurrence of a stereo signal during the sweep is employed to selectively short-circuit the resistor R4 again, thereby reducing the threshold Ux for the associated stereo components to the normal level described above; this permits the receiver to lock onto those components only.

To accomplish this, the voltage on line 13 is employed to forward-bias, during the time of occurrence of a stereo signal component, the emitter of a PNP transistor T4, whose base is maintained at zero potential. The resultant conduction of the transistor T4 effectively raises its collector potential, which thereupon triggers into conduction a field-effect unijunction transistor switch T3 connected across the resistor R4.

When the receiver is to operate in the preset mode "C" as indicated in Table I, switches S1 and S2 are moved from the position shown to decouple the capacitor voltage from the tuner 2 and to couple thereto a common lead 41 associated with a plurality of pushbuttons 24A–29A. The buttons 24A–29A are respectively connected in series with center taps 24B–29B of the potentiometers 24–29, each tap being individually settable to a voltage between U1 and U2. (As shown, the voltage on the tap 29B may be continuously adjusted between such limits by means of a knob 42.) Upon depression of one of the push-buttons 24A–29A, the voltage set on the associated tap is coupled via lead 41 and switch S2 to the line 6 to adjust the tuning stage 2 to a frequency corresponding thereto.

To operate in preset mode "D", an AFC capability may be added by operating the switch S4 and thereby effectively coupling the capacitor C1 across the potentiometers 24–29. As indicated before, the capacitor voltage, once locked on a strong signal, tends to compensate for receiver drift. In the AFC mode, therefore, any tendency for the receiver to drift after a preset frequency is selected will be compensated by an increase or decrease of voltage at the input (and therefore at the output tap) of the associated one of the potentiometers 24–29.

When operating in the AFC mode, the upper and lower voltage limits for the capacitor C1 are fixed at U2 and U1, respectively by the clamping diodes D5 and D6.

Figure 4:
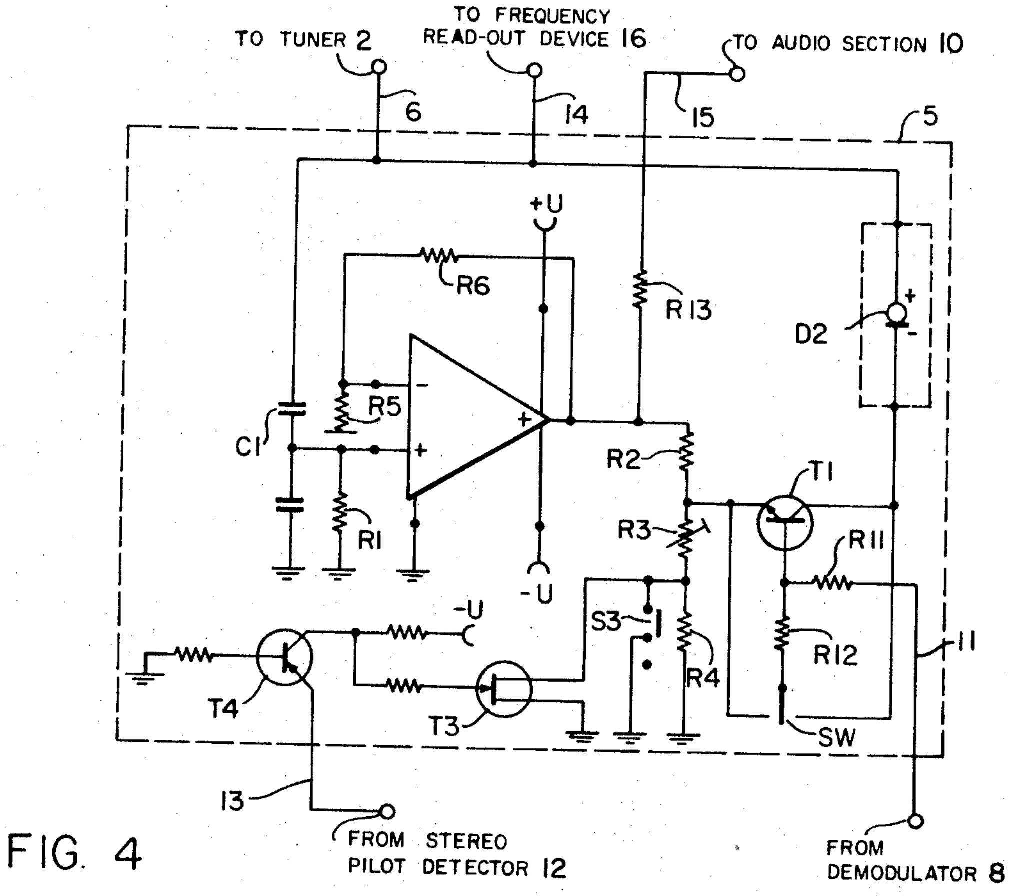
FIG. 4 is a schematic diagram of a modified form of the tuning frequency controller of FIG. 3.

In certain cases, the transistor T2 with its amplitude-changing phase-reversing characteristic may be omitted from the arrangement of FIG. 3, and the demodulator output coupled directly via resistor R11 to the base of the transistor T1 in the manner shown in FIG. 4. This arrangement is useful, e.g. when the demodulator is an FM discriminator whose output has a positive slope through zero for the locked-in frequency, as opposed to the negative slope of the demodulator output assumed in the discussion of FIG. 3. The discriminator characteristic must be appropriately selected, of course, to have an amplitude output curve compatible with the amplitudes required to operate the receiver in each of its described modes, and to isolate each captured frequency against frequency drift. In all other respects, the arrangement and operation of FIG. 4 is identical with that of FIG. 3.

Figure 5:
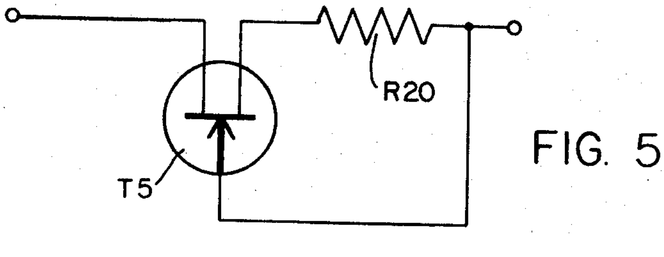
FIG. 5 is a schematic diagram of a field-effect transistor that may be substituted for the field-effect diode in the capacitor charging and discharging circuits of FIGS. 3 and 4.

The diodes D1 and D2 may be replaced, if desired, with other arrangements suitable for yielding constant-current operation over a preselected voltage range. One such arrangement shown in FIG. 5, includes a field-effect unijunction transistor T5 whose bases are serially connected with an output resistor R20. The output of such resistor is fed back to the emitter of the transistor T5.

In the foregoing the invention has been described in connection with illustrative arrangements thereof. Since many variations and modifications will now become obvious to those skilled in the art, it is desired that the breadth of the claims not be limited to the specific disclosure herein contained.

What is claimed is:

1. In a signal-seeking communications receiver including a voltage controlled tuning stage, a demodulator stage, a capacitor coupled to the tuning stage, means for varying the capacitor voltage to correspondingly sweep the frequency band received by the receiver, and means coupled to the output of the demodulator stage for detecting within the swept band a signal whose amplitude exceeds a predetermined threshold, an arrangement for both sweeping the received band in either of two opposite directions from any given starting point in the band and for detecting a signal having an amplitude above the threshold during a sweep in either of two opposite directions from any given starting point in the band, which comprises:

an operational amplifier having first and second complementary inputs, the output signal of the amplifier being proportional to the algebraic sum of the signals applied to the first and second inputs;

feedback means for applying the output of the amplifier to the first input thereof;

a first transistor;

a charging path for the capacitor including the second input and the output of the operational amplifier serially connected with the capacitor, the charging of the capacitor causing the tuning stage to sweep upward in frequency;

a discharge path for the capacitor including the collector-emitter path of the first transistor serially connected with the capacitor, the discharging of the capacitor causing the tuning stage to sweep downward in frequency;

first means for coupling the output of the demodulator stage to the base of the first transistor; and second means for coupling the output of the operational amplifier to the collector-emitter path of the first transistor.

2. Apparatus as defined in claim 1, further comprising first switching means selectively interconnecting the base of the first transistor with alternate sides of its collector-emitter path for momentarily biasing the first transistor into and out of conduction, respectively.

3. Apparatus as defined in claim 1, in which the charging and discharge paths each further includes a device exhibiting constant-current characteristics over the range of voltages applied thereto during the charging and discharging, respectively, of the capacitor.

4. Apparatus as defined in claim 3, in which each constant-current device is a field-effect diode.

5. Apparatus as defined in claim 3, in which each constant-current device comprises, in combination, a field-effect junction transistor, an output resistor serially connected with the two bases of the transistor, and means interconnecting the output of the resistor with the emitter of the transistor.

6. Apparatus as defined in claim 1, in which the first coupling means comprises, in combination, an amplifier having an input and an output in phase operation, third means for coupling the output of the amplifier to the base of the first transistor, and fourth means for coupling the output of the demodulator stage to the input of the amplifier.

7. Apparatus as defined in claim 6, in which the amplifier is a second transistor having a conductivity type opposite to that of the first transistor.

8. Apparatus as defined in claim 1, in which the second coupling means comprises a voltage divider having input terminals connected in the charging path and output terminals connected in the discharge path, and means for adjusting the output-input voltage ratio of the voltage divider.

9. Apparatus as defined in claim 1, further comprising means for individually establishing upper and lower limits, respectively, for the capacitor voltage.

10. Apparatus as defined in claim 1, in which the apparatus further comprises an auxiliary source of adjustable tuning voltage, and second switching means operable for decoupling the capacitor from the tuning stage and for coupling the auxiliary source to the tuning stage.

11. Apparatus as defined in claim 10, in which the auxiliary source comprises a potentiometer, and means for applying a selected voltage to the input of the potentiometer, the second switching means being effective when operated to connect the output of the potentiometer to the tuning stage.

12. Apparatus as defined in claim 11, in which the voltage applying means includes means for coupling the capacitor voltage to the input of the potentiometer while the second switching means are operated.

13. In a signal-seeking communications receiver which includes a demodulator stage coupled to a voltage-controlled tuning stage having a first input for receiving a tuning voltage, wherein the tuning stage is capable of adjustment over a frequency band that includes first and second frequency components, one of such frequency components being accompanied by a pilot signal:

a capacitor;

means for coupling the capacitor to the first input of the tuning stage;

an operational amplifier having first and second complementary inputs, the output signal of the amplifier being proportional to the algebraic sum of the signals applied to the first and second inputs thereof;

feedback means for applying the output of the operational amplifier to the first input thereof;

a transistor;

a voltage divider;

a charging path for the capacitor, the charging path including the second input and the output of the operational amplifier and the input impedance of the voltage divider serially connected with the capacitor;

a discharge path for the capacitor, the discharge path including the collector-emitter path of the transistor and the output impedance of the voltage divider serially connected with the capacitor;

means for coupling the output of the demodulator stage to the base of the transistor;

normally inoperative gating means having a transconductive path and a control electrode;

means for connecting the transconductive path of the gaging means across a portion of the output impedance of the voltage divider; and means coupled to the control electrode of the gating means and responsive to each occurrence of the pilot signal for operating the gating means to electrically bypass said output impedance portion.

14. Apparatus as defined in claim 13, further comprising switching means selectively interconnecting the base of the transistor with alternate sides of its collector-emitter path for momentarily biasing the transistor into and out of conduction, respectively.

15. Apparatus as defined in claim 13, in which each of the charging and discharging paths includes a constant-current device.

* * * * *